(12) United States Patent
Kuwahara (10) Patent No.: US 10,516,407 B2
(45) Date of Patent: Dec. 24, 2019

(54) SIGNAL PROCESSING DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Maho Kuwahara, Meguro Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/116,357

(22) Filed: Aug. 29, 2018

(65) Prior Publication Data

US 2019/0296757 A1 Sep. 26, 2019

(30) Foreign Application Priority Data

Mar. 20, 2018 (JP) ................................ 2018-052183

(51) Int. Cl.
*H03M 1/12* (2006.01)
*H03M 13/03* (2006.01)

(52) U.S. Cl.
CPC ........... *H03M 1/124* (2013.01); *H03M 13/03* (2013.01)

(58) Field of Classification Search
CPC .............................. H03M 1/124; H03M 13/03
USPC ................................................. 341/126–155
See application file for complete search history.

(56) References Cited

U.S. PATENT DOCUMENTS

| 4,207,523 | A | * | 6/1980 | Acker ..................... H04L 1/20 375/285 |
| 5,726,974 | A | * | 3/1998 | Kunieda .................. H04J 11/00 370/206 |
| 5,737,022 | A | * | 4/1998 | Yamaguchi .......... H04N 19/172 375/240.15 |
| 5,799,046 | A | * | 8/1998 | Hayashi ............. G11B 20/1426 375/341 |
| 6,085,211 | A | * | 7/2000 | Yoshioka ................ G06F 7/485 708/205 |
| 6,130,913 | A | * | 10/2000 | Yamaguchi ............... G06T 3/40 375/240.25 |

(Continued)

FOREIGN PATENT DOCUMENTS

| JP | 4854382 B2 | 1/2012 |
| JP | 4962766 B2 | 6/2012 |
| JP | 5132587 B2 | 1/2013 |

*Primary Examiner* — Lam T Mai
(74) *Attorney, Agent, or Firm* — White & Case LLP (57) ABSTRACT

According to embodiments, a signal processing device includes an AD converter, a memory, a prediction logic circuit, an error amount detection circuit, and a selector. The AD converter converts an input signal to an AD conversion value at a certain sampling frequency. The memory stores an AD conversion output result. The prediction logic circuit predicts a prediction value by using the AD conversion output result at the sampling frequency. The error amount detection circuit determines that there is no error in error determination of the AD conversion value when an error amount between the prediction value and the AD conversion value is smaller than a predetermined amount, and that there is an error in the error determination when the error amount is equal to or larger than the predetermined amount. The selector outputs one of the AD conversion value and the prediction value as an AD conversion output result, on the basis of the error determination.

19 Claims, 10 Drawing Sheets

(56) References Cited

U.S. PATENT DOCUMENTS

| | | | | |
|---|---|---|---|---|
| 6,829,299 B1* | 12/2004 | Chujoh | ............... | H04N 19/70 |
| | | | | 375/240 |
| 9,634,680 B1* | 4/2017 | Ray | ............... | H03M 1/0626 |
| 2002/0077812 A1* | 6/2002 | Suzuki | ............... | G10L 19/12 |
| | | | | 704/230 |
| 2014/0015703 A1* | 1/2014 | Pullela | ............... | H03M 1/50 |
| | | | | 341/166 |

* cited by examiner

SIGNAL PROCESSING DEVICE

CROSS-REFERENCE TO RELATED APPLICATIONS

This application is based upon and claims the benefit of priority from Japanese Patent Application No. 2018-052183, filed on Mar. 20, 2018; the entire contents of which are incorporated herein by reference.

FIELD

Embodiments described herein relate generally to a signal processing device.

BACKGROUND

There is known a technique for predicting future sample values using sample values acquired in the past when sampling reception signals at predetermined intervals and obtaining sample values by analog-to-digital (AD) conversion of the reception signals.

However, in conventional technique, an analog filter or a digital filter is used as countermeasures against disturbance such as noise in part of a reception signal. To obtain a higher noise reduction effect, higher-order filters are required. The higher-order filters lead to an increase in chip area in analog filters, and lead to, in digital filters, an increase in burden on hardware due to signal processing on input signals at a higher sampling rate.

DETAILED DESCRIPTION

According to embodiments, a signal processing device includes an AD converter, a memory, a prediction logic circuit, an error amount detection circuit, and a selector. The AD converter converts an input signal to an AD conversion value at a certain sampling frequency. The memory stores an AD conversion output result. The prediction logic circuit predicts a prediction value by using the AD conversion output result at the sampling frequency. The error amount detection circuit determines that there is no error in error determination of the AD conversion value when an error amount between the prediction value and the AD conversion value is smaller than a predetermined amount, and that there is an error in the error determination when the error amount is equal to or larger than the predetermined amount. The selector outputs one of the AD conversion value and the prediction value as an AD conversion output result, on the basis of the error determination.

Hereinafter, signal processing devices according to embodiments will be described below in detail with reference to the accompanying drawings. It should be noted that the present invention is not limited to these embodiments.

The signal processing devices described in the following embodiments are used, for example, in electromagnetic styluses. In the respective electromagnetic styluses (hereinafter referred to as a pen), power transmission to the pen and reception of electromagnetic waves from the pen generated by the power collected in the pen are performed by alternately using an antenna coil group arranged in arrays under a display panel, in a time division manner, with an identical coil. The electromagnetic waves emitted from the pen are electrically converted into a reception signal. This reception signal can be regarded as a continuous sinusoidal wave signal having a resonance frequency of an LC resonance circuit positioned in the pen, and detecting an amplitude and a phase of the reception signal enables acquisition of information indicating a state of the pen such as a position of the pen on the display and a writing pressure.

In particular, when the pen is away from the display, since a physical distance between the antenna coil and the pen increases, the reception signal is extremely weak and influence of disturbance noise and the like extremely increases. When a disturbance such as noise enters a part of a reception signal, the noise cannot be distinguished from a necessary signal, and detection accuracy in position of the pen deteriorates. In particular, when an input signal has an amplitude smaller relative to a receivable signal range, an adverse effect of the disturbance noise on the accuracy relatively increases, and the position detection accuracy of the pen deteriorates considerably.

Generally, to reduce noise, an analog filter or a digital filter is used, but to obtain a higher noise reduction effect, it is necessary to increase the order of the filter. However, increasing the order of the filter leads to an increase in the area of a chip in the analog filter. In addition, in the digital filter, signal processing needs to be performed at a higher sampling rate relative to input signal frequency, the speed of a digital circuit including an AD conversion circuit needs to be increased, and a burden on hardware is increased. Therefore, in the following embodiments, a signal processing device will be described which is configured to reduce disturbance noise with less increase in chip area, without need for digital processing at a high sampling rate, and with less burden on hardware.

First Embodiment

Figure 1:
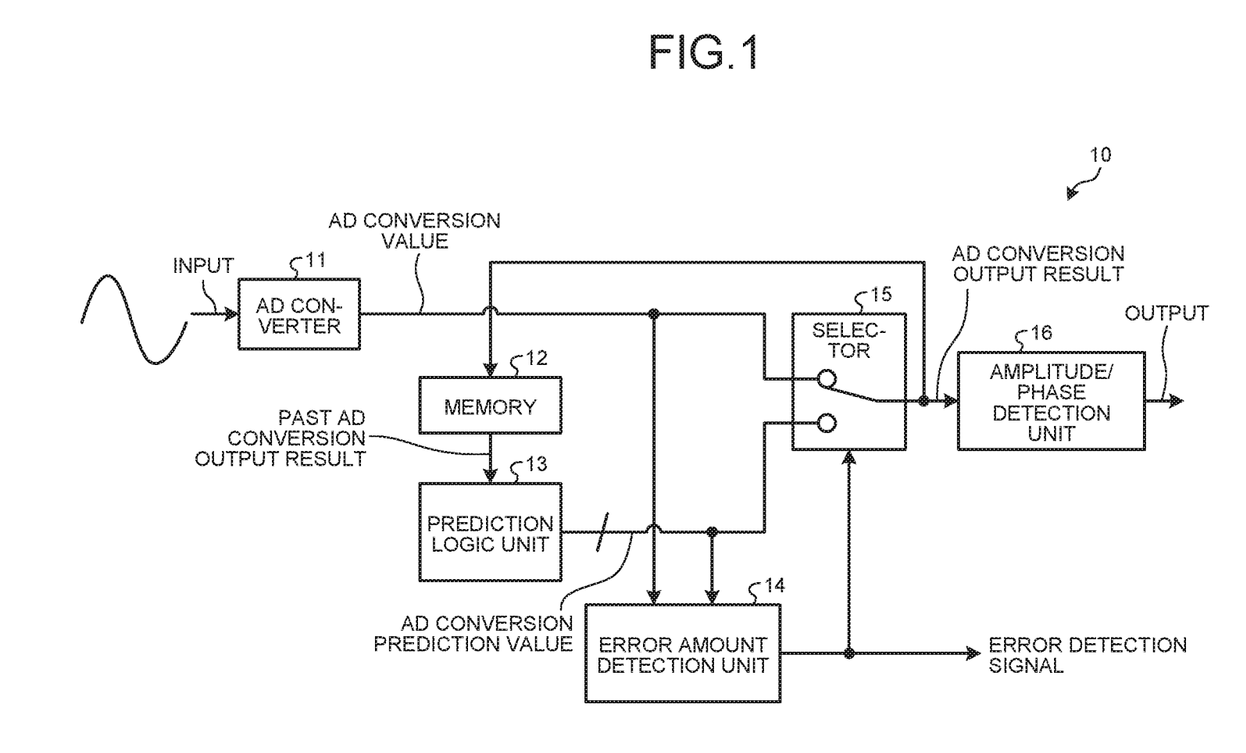
FIG. 1 is a block diagram illustrating an example of a hardware configuration of a signal processing device according to a first embodiment.

FIG. 1 is a block diagram illustrating an example of a hardware configuration of a signal processing device according to a first embodiment. The signal processing device 10 includes an AD converter 11, a memory 12, a prediction logic unit 13, an error amount detection unit 14, a selector 15, and an amplitude/phase detection unit 16.

The AD converter 11 converts a sampled input signal into a digital signal. The AD converter 11 outputs, as an AD conversion value, the digital signal after conversion to the error amount detection unit 14 and the selector 15.

The memory 12 temporarily stores an AD conversion output result in the past to be used in the prediction logic unit 13. For example, when four alternate past AD conversion output results are used, the memory 12 stores the latest eight AD conversion output results.

The prediction logic unit 13 predicts a next AD conversion value on the basis of the past AD conversion output results, on the assumption that an input signal has a sinusoidal wave. The prediction logic unit 13 outputs the predicted AD conversion value (hereinafter referred to as a prediction value) to the error amount detection unit 14 and the selector 15.

The error amount detection unit 14 compares the prediction value with the AD conversion value, performs error determination of the AD conversion value on the basis of an error amount which is a difference between the prediction value and the AD conversion value, and outputs an error detection signal including the result of the determination. The error detection signal includes information indicating the presence or absence of an error. That is, when an error amount is within a predetermined range, the error amount detection unit 14 determines that the AD conversion value does not include noise and has no error, and outputs an error detection signal including information indicating that there is no error. Further, when an error amount exceeds the predetermined range, the error amount detection unit 14 determines that the AD conversion value includes noise and has an error, and outputs an error detection signal including information indicating that there is an error.

In the present embodiment, the input signal is assumed to have a sinusoidal wave, and the AD conversion value is determined to have no error when the AD conversion value falls within the range of the prediction value in which the error is taken into consideration. Therefore, the predetermined range used for the determination may be, for example, an error range for predicting the prediction value. Furthermore, when an AD conversion value is within the error range, the AD conversion value is regarded as a normal value without an error, and the predetermined range may be a normal range of the AD conversion value.

On the basis of the error detection signal, the selector 15 selects either the AD conversion value or the prediction value and outputs the selected value as an AD conversion output result. Specifically, when receiving an error detection signal indicating that there is no error, the selector 15 selects the AD conversion value from the AD converter 11 and outputs the AD conversion value as the AD conversion output result. Furthermore, when receiving an error detection signal indicating that there is an error, the selector 15 selects the prediction value from the prediction logic unit 13 and outputs the prediction value as the AD conversion output result.

The amplitude/phase detection unit 16 detects the amplitude and the phase of the input signal on the basis of the continuous AD conversion output results in the past. Detection of the amplitude and the phase of the input signal enables detection of information indicating a state of the pen such as a position of the pen on the display and a writing pressure. The above AD converter 11, memory 12, prediction logic unit 13, error amount detection unit 14, selector 15, and amplitude/phase detection unit 16 each include, for example, a circuit.

Figures 2A, 2B, 2C:
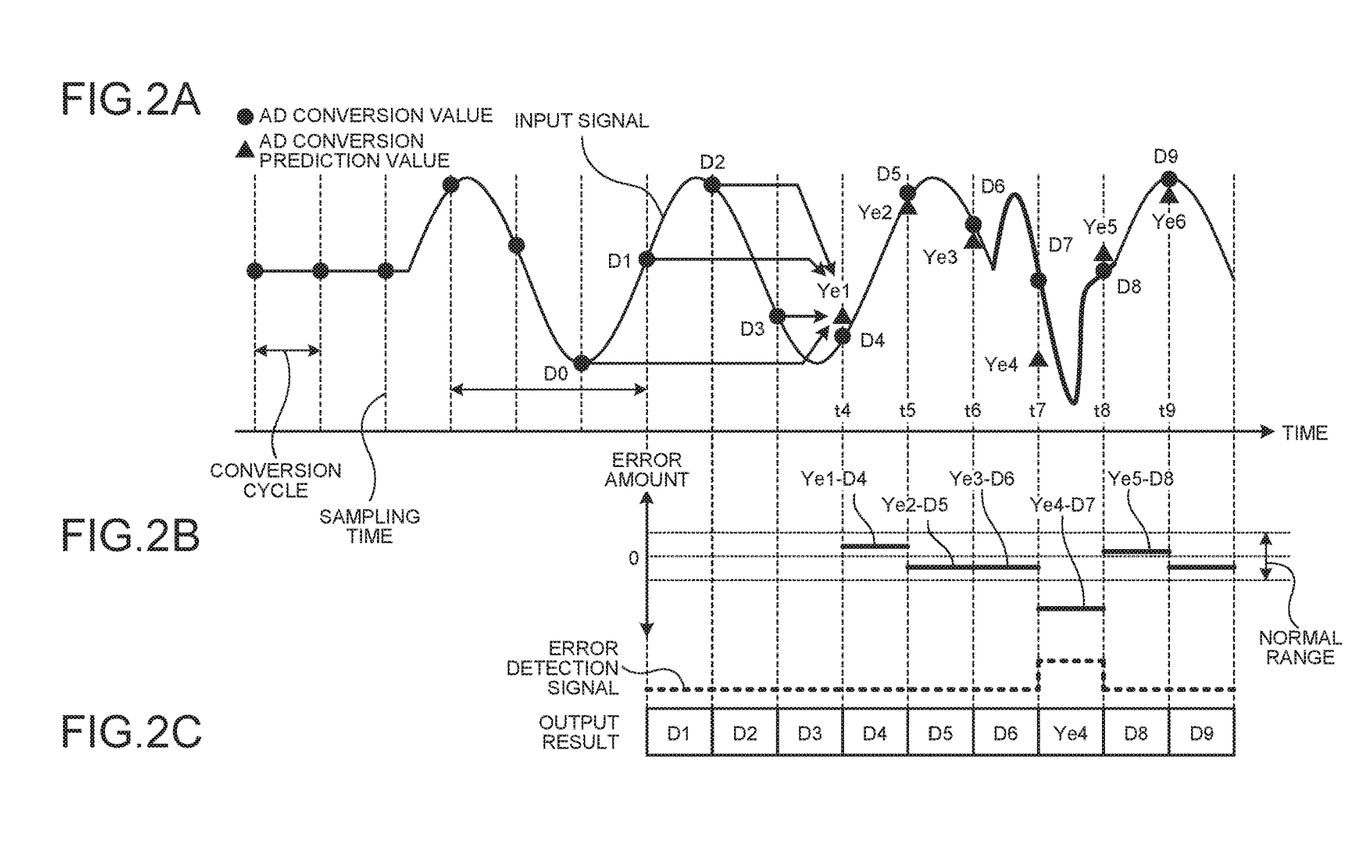
FIGS. 2A to 2C are graphs and a table illustrating an example of an operation waveform in the signal processing device according to the first embodiment.

Next, operation of the signal processing device 10 will be described. FIGS. 2A to 2C are graphs and a table illustrating an example of an operation waveform in the signal processing device according to the first embodiment. The horizontal axis represents time. FIG. 2A illustrates a temporal change of an AD conversion value and a prediction value. The AD conversion value is indicated by black circles, and the prediction value is indicated by black triangles. FIG. 2B illustrates the temporal change of an error amount between the prediction value and the AD conversion value and a state of the presence or absence of an error in an error detection signal. In FIG. 2C, AD conversion output results selected by the selector 15 are illustrated.

At the start of the operation, AD conversion values are output as the AD conversion output results from the selector 15, and the AD conversion output results are sequentially stored in the memory 12. When a predetermined number of past AD conversion output results are stored in the memory 12, the prediction logic unit 13 predicts a next AD conversion value on the basis of the past AD conversion output results and calculates a prediction value. Here, the next prediction value is calculated on the basis of continuous past four AD conversion output results. For example, at sampling time t4, a prediction value Ye1 is calculated using past AD conversion output results (AD conversion values) D0 to D3. Similarly, prediction values Ye2 to Ye6 are calculated at sampling time t5 to t9.

At each sampling time, the error amount detection unit 14 compares a prediction value Yei (i is a natural number) from the prediction logic unit 13 and an AD conversion value Dj (j is an integer of 0 or more) from the AD converter 11, and calculates an error amount being a difference between the prediction value Yei and the AD conversion value Dj. For example, at sampling time t4 to t9, error amounts Ye1-D4, Ye2-D5, Ye3-D6, Ye4-D7, and Ye5-D8 are calculated, in FIG. 2B. The error amount detection unit 14 determines whether each error amount falls within a predetermined range (normal range in FIG. 2B). When an error amount falls within the normal range, an error detection signal indicating that there is no error is output, and when an error amount does not fall within the normal range, an error detection signal indicating that there is an error is output. FIG. 2B illustrates error detection signals at a level L with no error, and an error detection signal at a level H with an error. For example, at sampling time t7, an error amount Ye4-D7 does not fall within the normal range, and the error detection signal at the level H is output.

The selector 15 selects one of inputs from the AD converter 11 and the prediction logic unit 13, on the basis of these error detection signals. That is, when the error amount is within the normal range, the selector 15 selects and outputs the AD conversion value as the AD conversion output result, and when the error amount is not within the normal range, the selector 15 selects and outputs the prediction value as the AD conversion output result. For example, in the example of FIG. 2A, an operation example of a case where unexpected disturbance noise enters between sampling time t6 and sampling time t7 is illustrated. As illustrated in FIG. 2B, at and before sampling time t6 and at and after sampling time t8, the disturbance noise does not enter, and the prediction values and the AD conversion values are close to each other. Therefore, at each sampling time at and before sampling time t6 and at and after sampling time t8, the selector 15 outputs AD conversion values D1 to D6, D8 and D9. In contrast, at sampling time t7, a difference between the prediction value and the AD conversion value is large due to the influence of the disturbance noise. Therefore, at sampling time t7, the selector 15 outputs a prediction value Ye4. The AD conversion output results D1 to D6, Ye4, D8, and D9 are stored in the memory 12 and serve as data for predicting subsequent prediction values.

Figure 3:
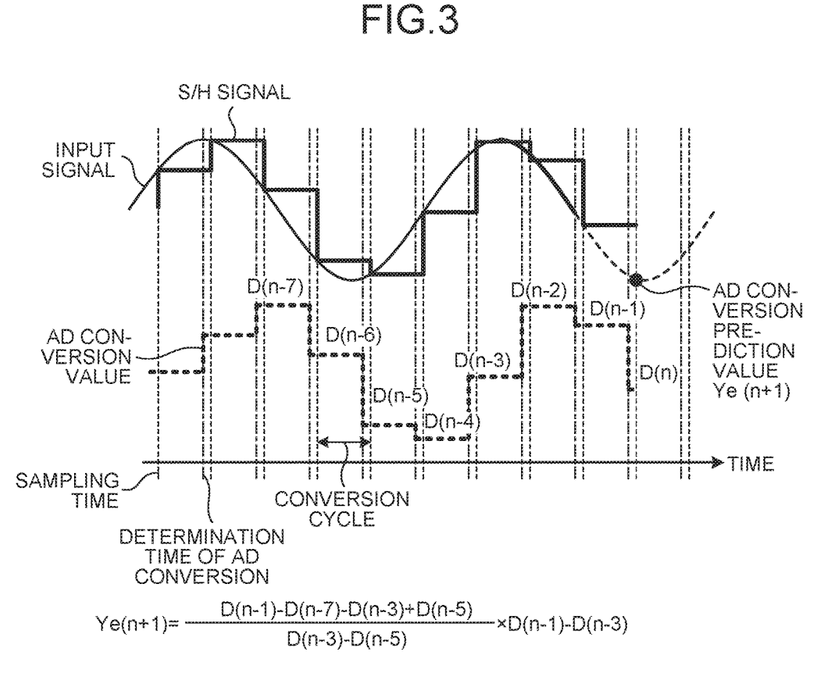
FIG. 3 is a graph illustrating an example of a first prediction method.

Here, a method of predicting a prediction value from past AD conversion values will be described. FIG. 3 is a graph illustrating an example of a first prediction method. FIG. 3 illustrates an input signal, a signal (S/H signal) obtained by sampling and holding the input signal, and a behavior of an AD conversion value D(x) corresponding to the S/H signal. The horizontal axis represents time. The AD conversion value is determined before next sampling time, and a prediction value Ye(n+1) of the input signal is calculated from past four AD conversion values D(n−1), D(n−3), D(n−5), and D(n−7), according to the following formula (1).

$$Ye(n+1) = \frac{D(n-1) - D(n-7) - D(n-3) + D(n-5)}{D(n-3) - D(n-5)} \times D(n-1) - D(n-3) \quad (1)$$

The AD conversion value D(x) has positive and negative output codes (for example, −512 to 511 in the case of 10 bits), and a relationship of the output code to an input voltage is such that an AD conversion value may be 0 when an average voltage of a sinusoidal wave signal is input. According to formula (1), the next AD conversion value can be predicted by performing calculations of one multiplication, one division, and five additions/subtractions.

Figure 4:
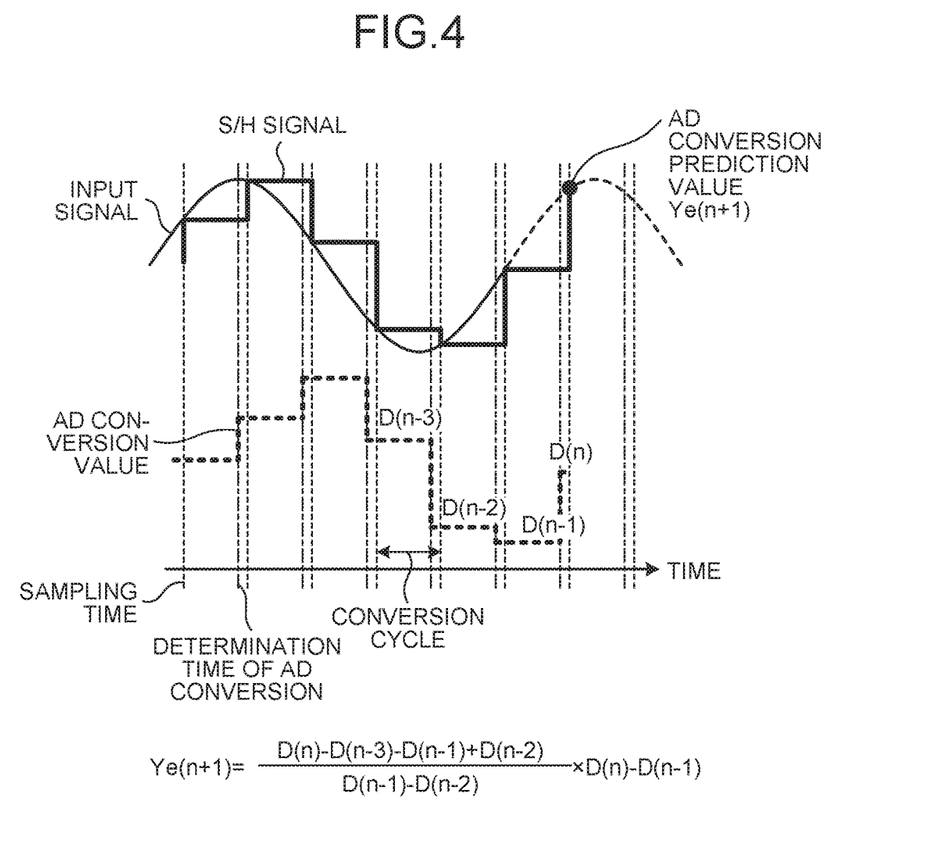
FIG. 4 is a graph illustrating an example of a second prediction method.

FIG. 4 is a graph illustrating an example of a second prediction method. FIG. 4 also illustrates an input signal, a signal (S/H signal) obtained by sampling and holding the input signal, and a behavior of an AD conversion value D(x) corresponding to the S/H signal. The horizontal axis represents time. In the first prediction method, the past AD conversion values D(x) used for the prediction are data alternately sampled at a sampling rate. In contrast, in the second prediction method, past AD conversion values D(x) used for a prediction value Ye(n+1) is continuous data D(n−3), D(n−2), D(n−1), and D(n) sampled at a sampling rate. The prediction value Ye(n+1) is calculated from these data, according to the following formula (2).

$$Ye(n+1) = \frac{D(n) - D(n-3) - D(n-1) + D(n-2)}{D(n-1) - D(n-2)} \times D(n) - D(n-1) \quad (2)$$

Similarly, the AD conversion value D(x) has positive and negative output codes, and a relationship of an output code to an input voltage is such that an AD conversion value may be 0 when an average voltage of a sinusoidal wave signal is input.

On the basis of formulas (1) and (2), generally, let a be an integer of 1 or more and D(n) be the latest AD conversion value, then the prediction value Ye(n+1) is calculated according to the following formula (3).

$$Ye(n+1) = \frac{D(n-a+1) - D(n-4a+1) - D(n-2a+1) + D(n-3a+1)}{D(n-2a+1) - D(n-3a+1)} \times D(n-a+1) - D(n-2a+1) \quad (3)$$

Calculation of formula (3) is performed between determination time of an AD conversion value D(n) and sampling time of next AD conversion. In this manner, the prediction value (a value obtained at time after the same interval as a time interval for obtaining the past AD conversion value used for prediction) is obtained on the basis of formula (1) or (2). Furthermore, the prediction value is not used before predetermined time (before the input signal has a waveform closer to a sinusoidal wave). That is, before the predetermined time, the AD conversion values are output, and the AD conversion values D(x) are used for prediction of the prediction value Ye(n+1). After the predetermined time, either the prediction value or the AD conversion value is selected (that is, the AD conversion output result is used).

In the first embodiment, on the assumption that the input signal has a waveform closer to a sinusoidal wave, the prediction logic unit 13 predicts a prediction value from the past AD conversion output results, and the error amount detection unit 14 determines whether the error amount being a difference between the prediction value and the AD conversion value is within the normal range. When the error amount is within the normal range, the selector 15 takes the AD conversion value as the AD conversion output result, and when the error amount is not within the normal range, the selector 15 takes the prediction value as the AD conversion output result. Thus, when amplitude information and phase information of the input signal are detected from the AD conversion output result, degradation in detection accuracy due to input such as disturbance can be reduced.

Since the prediction value is predicted on the assumption that the input signal has a waveform closer to a sinusoidal wave, the need for signal processing at a higher sampling rate is unnecessary for input signal frequency without increasing the order of an analog filter. As a result, the signal processing device 10 is provided which is configured to reduce disturbance noise with less increase in chip area, without need for digital processing at a high sampling rate, and with less burden on the hardware.

Second Embodiment

Figure 5:
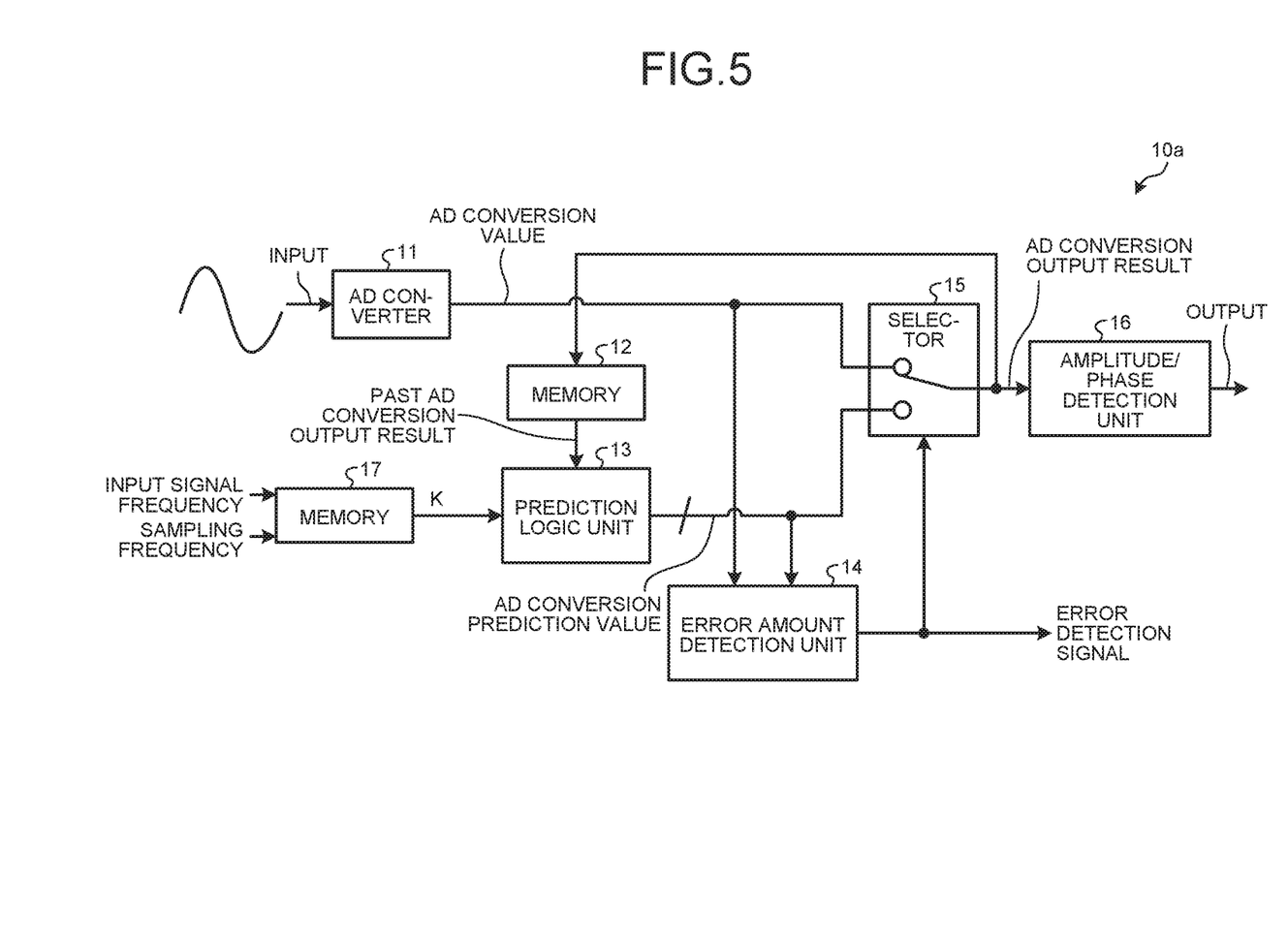
FIG. 5 is a block diagram illustrating an example of a hardware configuration of a signal processing device according to a second embodiment.

FIG. 5 is a block diagram illustrating an example of a hardware configuration of a signal processing device according to a second embodiment. In the second embodiment, it is assumed that an input signal assumed to have a sinusoidal wave has a known frequency. In addition to the configuration of the signal processing device 10 of FIG. 1, the signal processing device 10a further includes a memory 17 that stores a fixed coefficient value K based on known frequency information of an input signal and sampling frequency information. For example, in a system such as a stylus, a resonance frequency falls within a certain narrow range according to a self-inductance L of the stylus and a constant of an electric capacitance C, and the memory 17 stores fixed coefficient values K of a number according to the number of combinations of the types of frequencies of reception signals returned and the types of sampling frequencies used.

When predicting a prediction value from past AD conversion output results, the prediction logic unit 13 acquires a fixed coefficient value K from the memory 17, and calculates a prediction value by using a predetermined function. Note that the same components as those in the first embodiment are denoted by the same reference numerals, and description thereof is omitted.

Figure 6:
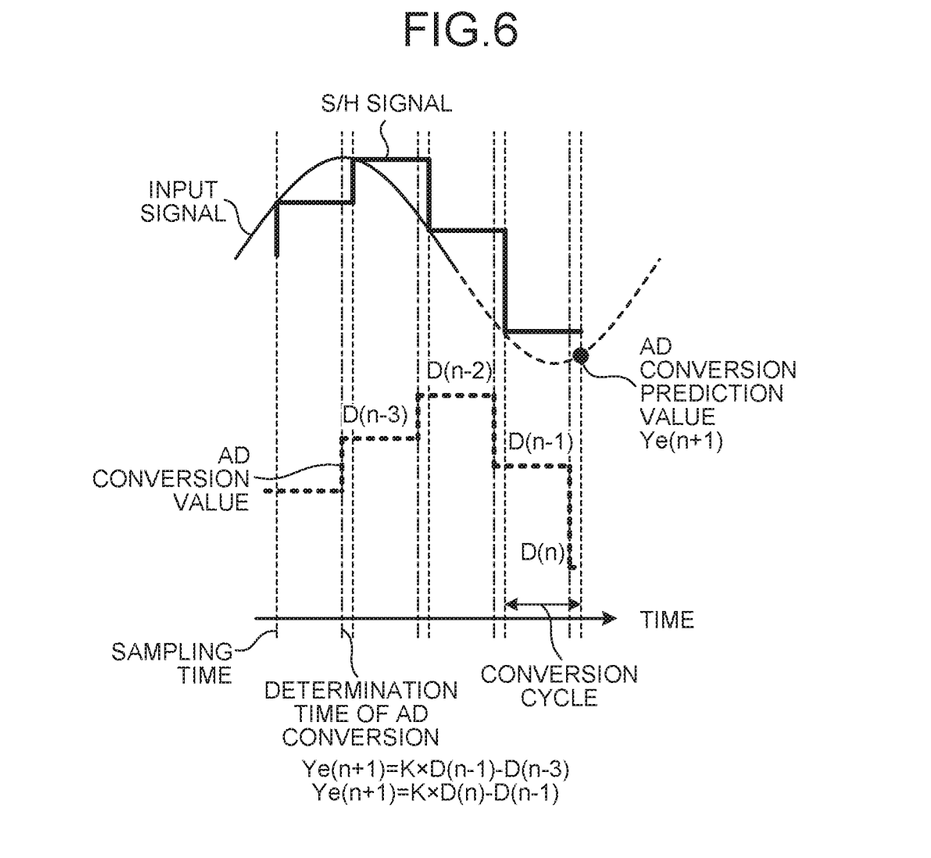
FIG. 6 is a graph illustrating an example of a third and fourth prediction methods.

A method of predicting a prediction value will be described. FIG. 6 is a graph illustrating an example of a third and fourth prediction methods. FIG. 6 illustrates an input signal, a signal (S/H signal) obtained by sampling and holding the input signal, and a behavior of an AD conversion value D(x) corresponding to the S/H signal. The horizontal axis represents time.

In the third method, a prediction value Ye(n+1) is calculated from data D(n−1) and D(n−3) alternately sampled at a sampling rate, according to the following formula (4).

$$Ye(n+1)=K \cdot D(n-1)-D(n-3) \quad (4)$$

In the fourth method, a prediction value Ye(n+1) is calculated from continuous data D(n) and D(n−1) sampled at a sampling rate, according to the following formula (5).

$$Ye(n+1)=K \cdot D(n)-D(n-1) \quad (5)$$

On the basis of formulas (4) and (5), generally, let a be an integer of 1 or more and let D(n) be the latest AD conversion value, then the prediction value Ye(n+1) is calculated from two past AD conversion values D(x), according to the following formula (6).

$$Ye(n+1)=K \cdot D(n-a+1)-D(n-2a+1) \quad (6)$$

As in the case of formulas (1) to (3), before predetermined time, the AD conversion values D(x) are used for prediction of the prediction value Ye(n+1). After the predetermined time, for prediction of the prediction value Ye(n+1), not the AD conversion value but an AD conversion output result is used as D(x).

The AD conversion value D(x) has positive and negative output codes, and a relationship of an output code to an input voltage is such that an AD conversion value may be 0 when an average voltage of a sinusoidal wave signal is input. The fixed coefficient value K is determined by a combination of the type of frequency of a reception signal returned and a sampling frequency used, and has a value of not less than −2 and not more than 2. Furthermore, by setting the obtained fixed coefficient value K to such a value that calculation of the first term on the right side of each of formulas (4) to (6) is a bit shift and addition, the calculation in the prediction logic unit 13 is facilitated. For example, by setting K=0.75, 0.875, 1.00, 1.125, 1.25, 1.375, 1.5, 1.675, and 1.8, calculation is facilitated and a burden on the hardware can be reduced. Formulas (4) to (6) are further based on a sinusoidal-wave generation method using a generally known second-order infinite impulse response (IIR) filter.

In the second embodiment, as long as the frequency information of the input signal is known, the prediction value can be obtained by performing one multiplication and one addition, as illustrated in formulas (4) to (6). Furthermore, although an example of the fixed coefficient value K has been described by taking a value calculated on the basis of the frequency information and the sampling frequency information, not only the above two pieces of information but also other information may be added to obtain the fixed coefficient value K. For example, some reception signals have a sinusoidal wave having an amplitude gradually decreasing monotonically. In this case, more accurate prediction can be performed by determining the fixed coefficient value K in consideration of this reduction rate.

In the second embodiment, the fixed coefficient value K calculated on the basis of the frequency information of the input signal and the sampling frequency information is stored in the memory 17, and the prediction value is calculated by the prediction logic unit 13 by using the fixed coefficient value K. As a result, compared to the first embodiment, the amount of calculation required for prediction can be reduced, and the effect of reducing the amount of hardware can be obtained in addition to the effects of the first embodiment.

Third Embodiment

Figure 7:
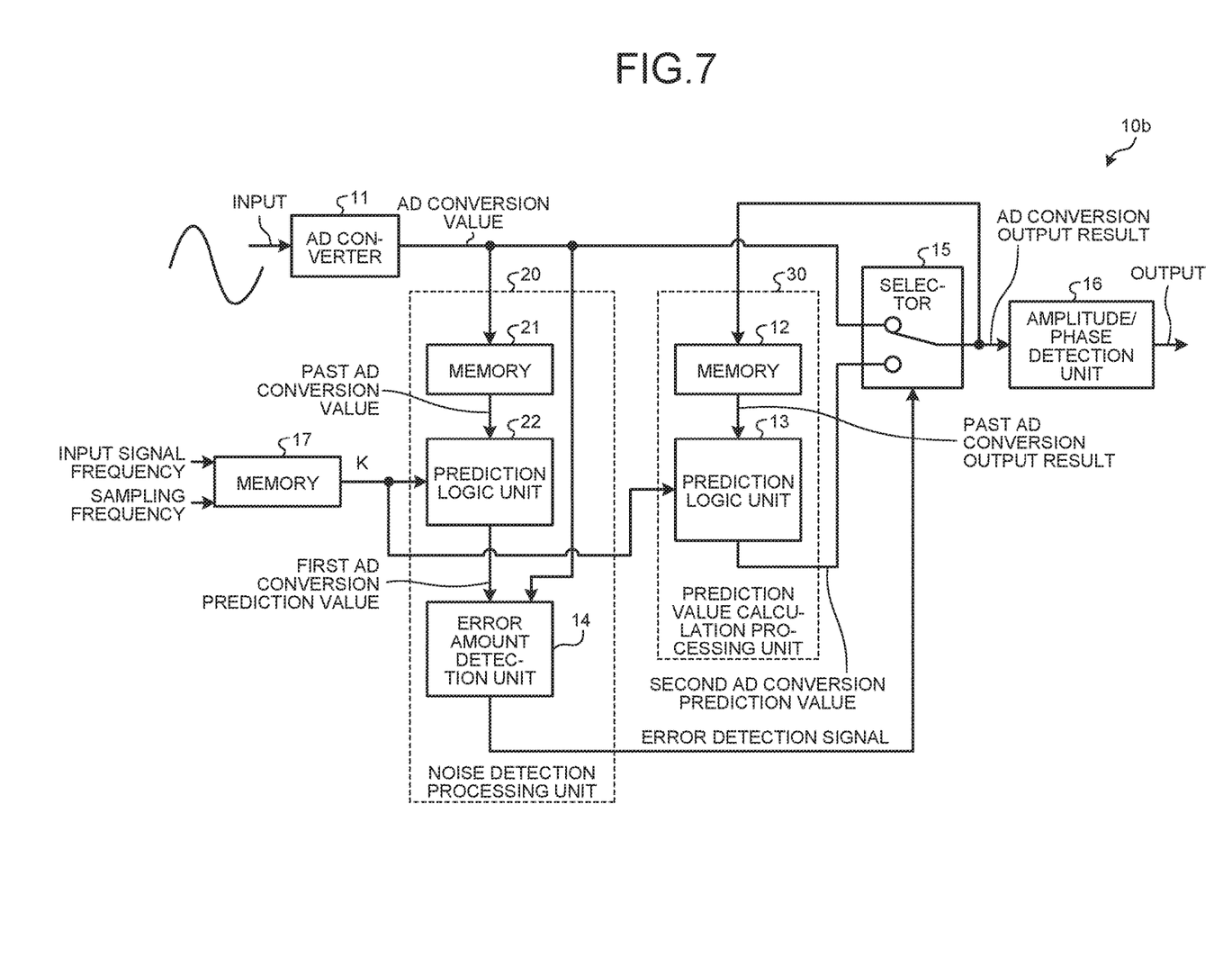
FIG. 7 is a block diagram illustrating an example of a hardware configuration of a signal processing device according to a third embodiment.

FIG. 7 is a block diagram illustrating an example of a hardware configuration of a signal processing device according to a third embodiment. The signal processing device 10b includes the AD converter 11, the memory 17, a noise detection processing unit 20, a prediction value calculation processing unit 30, the selector 15, and the amplitude/phase detection unit 16.

The noise detection processing unit 20 includes a memory 21, a prediction logic unit 22, and the error amount detection unit 14. The memory 21 temporarily stores past AD conversion values.

The prediction logic unit 22 predicts a prediction value, on the basis of the past AD conversion values, on the assumption that an input signal has a sinusoidal wave. Hereinafter, the prediction value calculated by the prediction logic unit 22 is referred to as a first prediction value. The prediction logic unit 22 outputs the first prediction value to the error amount detection unit 14. As in the second embodiment, the prediction logic unit 22 reads a fixed coefficient value K calculated on the basis of frequency information of an input signal and sampling frequency information, from the memory 17, and calculates the first prediction value, for example, according to any of formulas (4) to (6). In formulas (4) to (6), a first prediction value Ye1(n+1) is calculated by using a past AD conversion value D1(x).

The error amount detection unit 14 compares the first prediction value with the AD conversion value to determine whether an error amount which is a difference between the first prediction value and the AD conversion value is within a predetermined range, and outputs an error detection signal including the result of the determination to the selector 15.

The prediction value calculation processing unit 30 includes the memory 12 and the prediction logic unit 13. The memory 12 temporarily stores past AD conversion output results. The prediction logic unit 13 predicts a next prediction value on the basis of the past AD conversion output results, on the assumption that an input signal has a sinusoidal wave. Hereinafter, the prediction value calculated by the prediction logic unit 13 is referred to as a second prediction value. The prediction logic unit 13 outputs the second prediction value to the selector 15. As in the second embodiment, the prediction logic unit 13 reads a fixed coefficient value K calculated on the basis of frequency information of an input signal and sampling frequency information, from the memory 17, and calculates the second prediction value, for example, according to any of formulas (4) to (6). In formulas (4) to (6), a second prediction value Ye2(n+1) is calculated by using a past AD conversion output result D2(x).

On the basis of the error detection signal, the selector 15 selects either the AD conversion value or the second prediction value and outputs the selected value as an AD conversion output result. Specifically, when receiving an error detection signal indicating that there is no error, the selector 15 selects the AD conversion value from the AD converter 11 and outputs the AD conversion value as the AD conversion output result. Furthermore, when receiving the error detection signal indicating that there is an error, the selector 15 selects the second prediction value from the prediction logic unit 13 and outputs the second prediction value as the AD conversion output result.

The amplitude/phase detection unit 16 detects the amplitude and the phase of the input signal on the basis of the continuous AD conversion output results in the past. The above AD converter 11, memory 17, memory 21, prediction logic unit 22, error amount detection unit 14, memory 12, prediction logic unit 13, selector 15, amplitude/phase detection unit 16 each include, for example, a circuit.

In the first and second embodiments, the prediction value used for detecting the error amount is calculated on the basis of the past AD conversion output result, whereas in the third embodiment, on the basis of the AD conversion value, the first prediction value to be used for detecting the error amount is calculated.

Figure 8A:
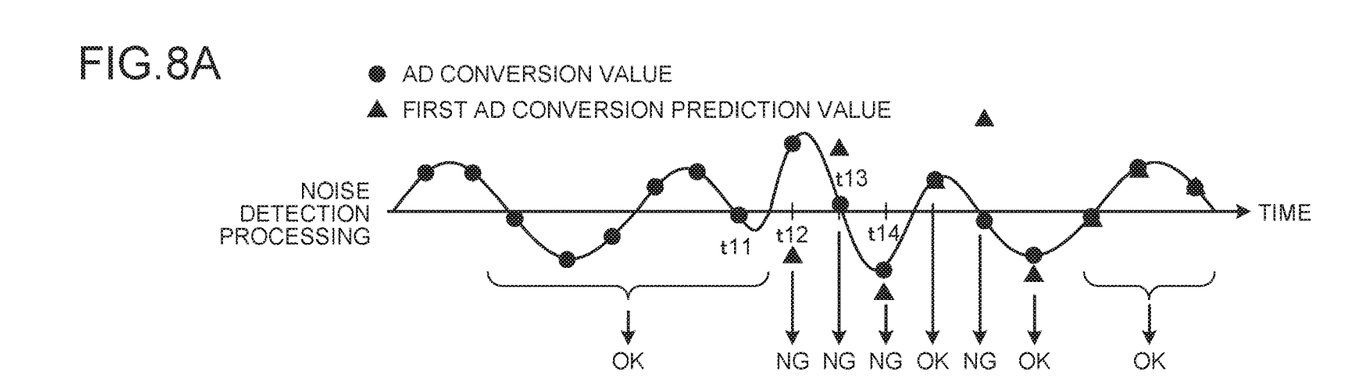
FIGS. 8A and 8B are graphs each illustrating an example of an operation waveform in the signal processing device according to the third embodiment.
Figure 8B:
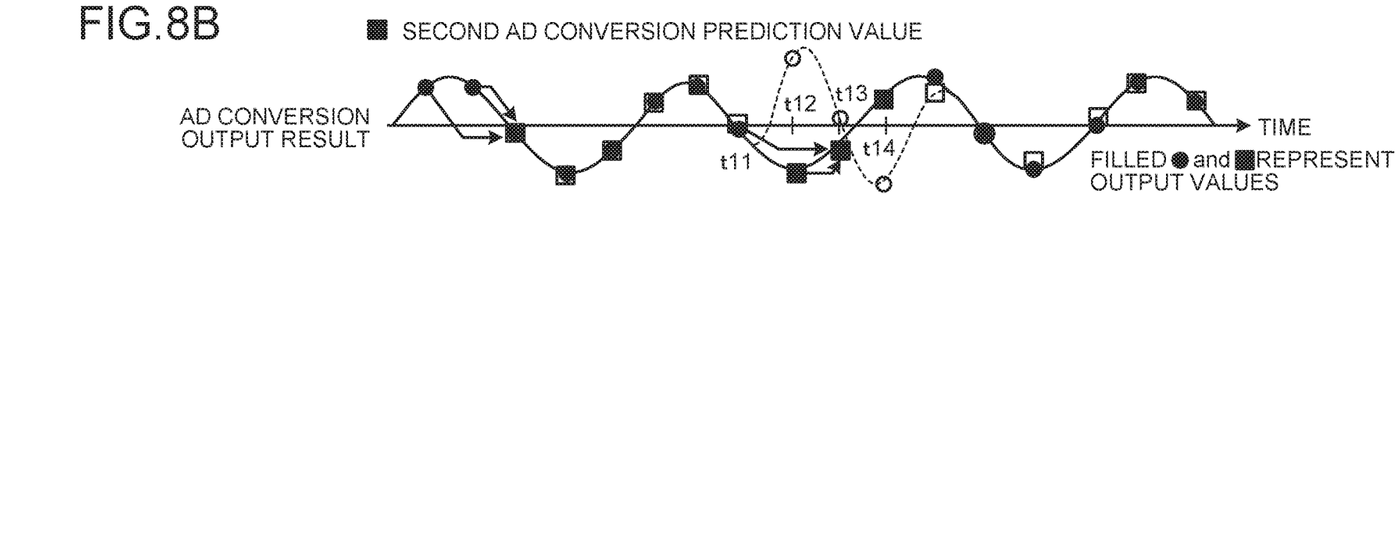

Next, the operation of the signal processing device 10*b* will be described. FIGS. 8A and 8B are graphs each illustrating an example of an operation waveform in the signal processing device according to the third embodiment. FIG. 8A illustrates AD conversion values and first prediction values in the noise detection processing unit, and FIG. 8B illustrates AD conversion output results. In these figures, the horizontal axis represents time. In the first and second embodiments, the prediction value is a value predicted on the basis of the AD conversion output result, but in the third embodiment, the first prediction value is always predicted only from an AD conversion value of an input signal. The other operations are the same as those in the first and second embodiments.

That is, an error amount is detected between the AD conversion value and the first prediction value. Then, as illustrated in FIG. 8B, when the error amount is small, the AD conversion value is selected as the AD conversion output result, and when the error amount is large, a second prediction value is selected as the AD conversion output result.

For example, at sampling time t11, there is no influence of noise, and the AD conversion value and the first prediction value have substantially the same value. Therefore, an error amount determination result also falls within a normal range, it is determined that there is no error, and the AD conversion value is output. In contrast, at sampling time t12 to t14, the AD conversion values indicate abnormal values, and the error amount determination results are also above the normal range, and it is determined that there is an error. Therefore, at sampling time t12 to t14, the second prediction value is output.

As described above, in the third embodiment, the AD conversion value is used as input data for predicting the first prediction value. In the case of performing the error detection determination by using the prediction value predicted from the AD conversion output result, when the prediction value is continuously selected as the AD conversion output result for a long period, a difference between the AD conversion value and the prediction value accumulates, and the accuracy of the prediction value itself degrades in some cases. Considering that there is a temporal large shift in the input signal from the sinusoidal wave for a certain period due to, for example, application of disturbance noise, and then the input signal is restored to a neat sinusoidal wave free from the influence of noise, when the error of the prediction value increases, not the AD conversion value of the input signal which is free from the noise and should be selected, but the prediction value is disadvantageously selected.

In contrast, in the third embodiment, when the input signal has a sinusoidal wave free from the influence of noise, an error between the first prediction value and the AD conversion value based on this sinusoidal wave signal reduces, and the AD conversion value is selected as the AD conversion output result. As a result, the second prediction value has a prediction value obtained from the AD conversion output result including the AD conversion value, and the prediction from the past prediction value is not continued for a long time. As a result, disadvantageous selection of the prediction value can be avoided, when there is a temporal large shift in the input signal from the sinusoidal wave for a certain period due to, for example, application of disturbance noise, and then the input signal is restored to a neat sinusoidal wave free from the influence of noise.

Fourth Embodiment

Figure 9:
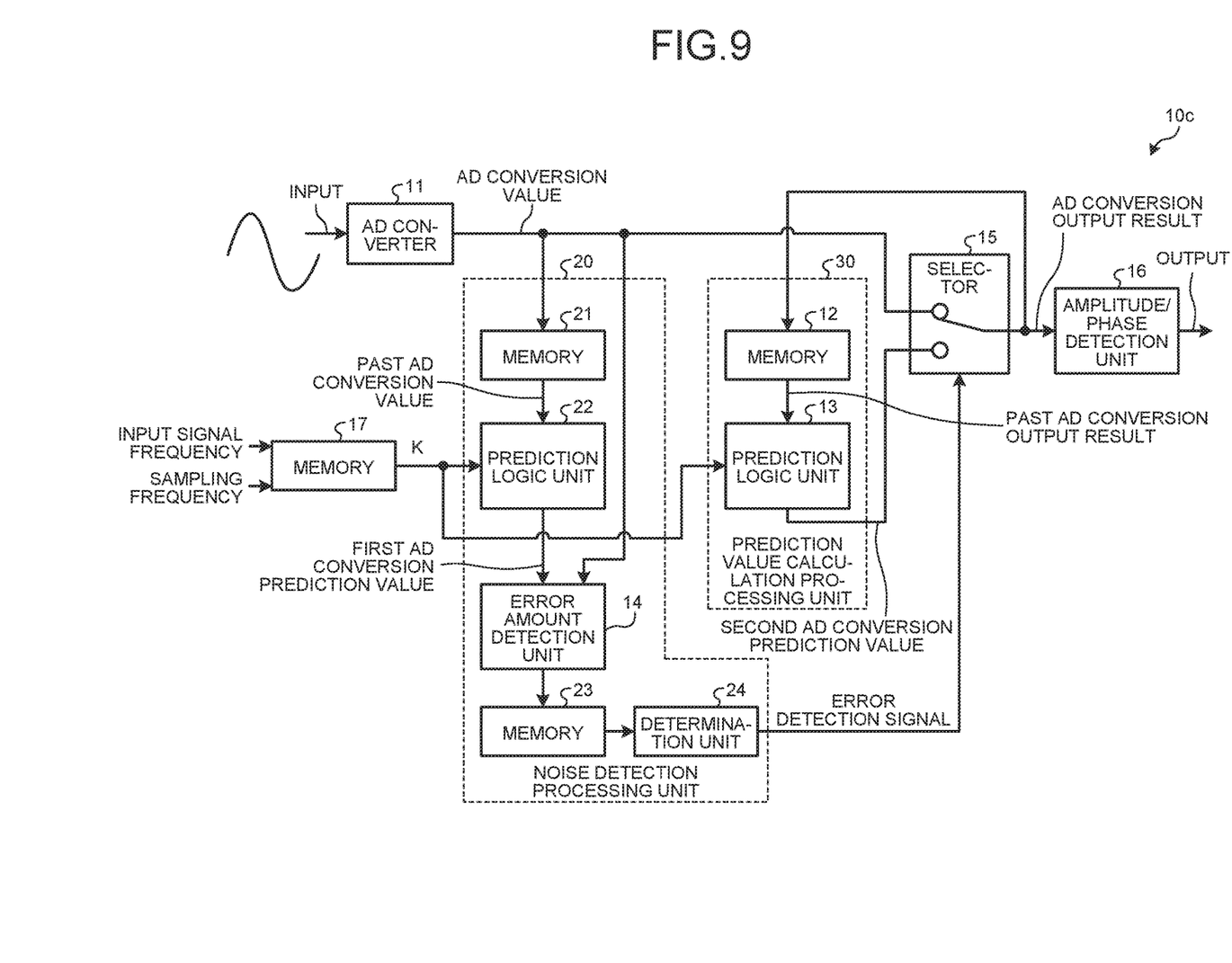
FIG. 9 is a block diagram illustrating an example of a hardware configuration of a signal processing device according to a fourth embodiment.

FIG. 9 is a block diagram illustrating an example of a hardware configuration of a signal processing device according to a fourth embodiment. In addition to the configuration of the signal processing device 10*b* according to the third embodiment, the signal processing device 10*c* further includes a memory 23 and a determination unit 24 in the noise detection processing unit 20. The memory 23 temporarily stores a plurality of results of determination in the past from the error amount detection unit 14. A desired number of the results of determination are stored in the memory 23.

After the results of determination from the error amount detection unit 14 are stored in the memory 23, the determination unit 24 determines whether there is an error in any of the plurality of results of determination, from the oldest to the latest results of the determination, stored in the memory 23, and outputs an error detection signal to the selector 15 according to a result of the determination. More specifically, when there is an error in any of the results of the determination in the memory 23, the determination unit 24 outputs an error detection signal including information indicating that there is an error. In contrast, when there is no error in the results of the determination in the memory 23, the determination unit 24 outputs an error detection signal including information indicating that there is no error.

That is, in the fourth embodiment, even though it is determined that there is no error by the error amount detection unit 14, when there is an error in any of the results of the determination in the memory 23, an error detection signal including information indicating that there is an error is output. As described above, when a large error amount is once detected, not the AD conversion value but a second prediction value is used as an AD conversion output result in a predetermined period. This is effective when sporadic disturbance noise is generated and the disturbance noise is removed in a certain response time period.

The error amount detection unit 14 stores, in the memory 23, a result of comparison between a first prediction value and an AD conversion value, that is, information indicating whether the AD conversion value is an error. However, the error amount detection unit 14 does not output the error detection signal, unlike the first to third embodiments. Note that the same components as those in the first to third embodiments are denoted by the same reference numerals, and description thereof is omitted. Further, the memory 23 and the determination unit 24 each include, for example, a circuit.

Figure 10A:
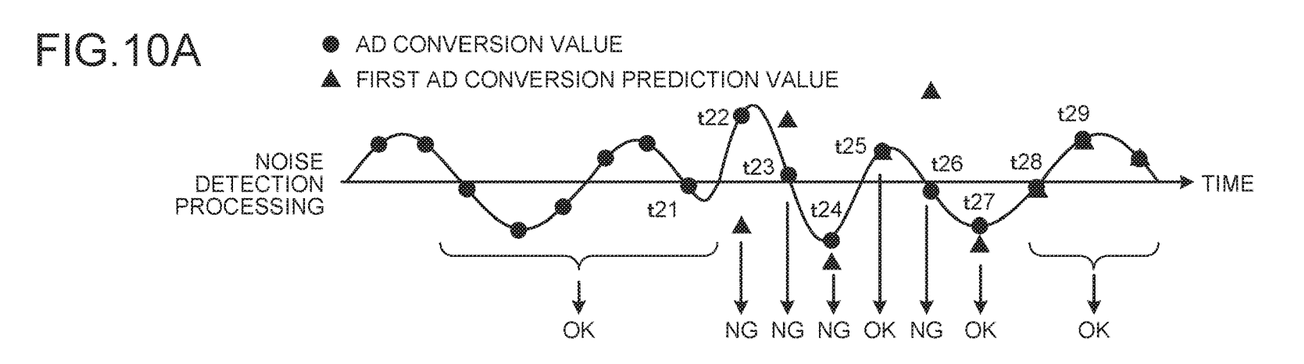
FIGS. 10A to 10C are graphs and a table illustrating an example of an operation waveform in the signal processing device according to the fourth embodiment, and a table.
Figure 10B:
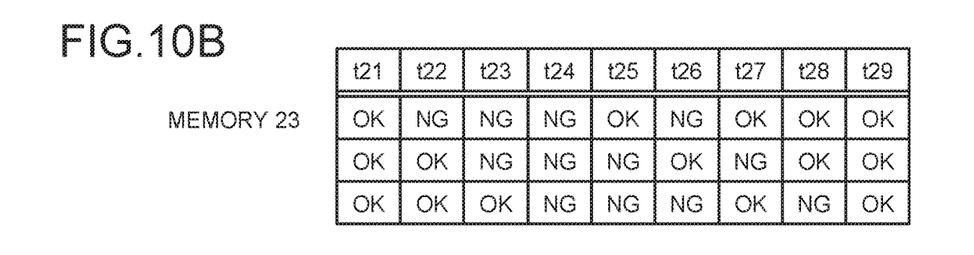
Figure 10C:
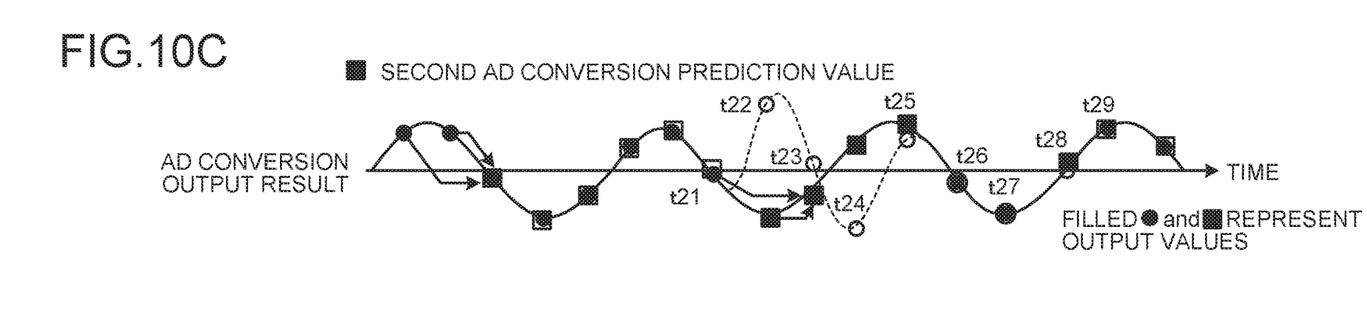

Next, the operation of the signal processing device 10c will be described. FIGS. 10A to 10C are graphs and a table each illustrating an example of an operation waveform in the signal processing device according to the fourth embodiment. FIG. 10A illustrates AD conversion values and first prediction values in the noise detection processing unit, FIG. 10B illustrates error amount determination results in the past, and FIG. 10C illustrates AD conversion output results. The horizontal axis represents time. Here, three results of determination including the latest error amount determination result are stored in the memory 23.

Since a difference between a first prediction value and an AD conversion value is within a normal range at or before sampling time t21, the error amount detection unit 14 writes an error amount determination result indicating that there is no error, in the memory 23. Furthermore, the determination unit 24 refers to the memory 23, and outputs an error detection signal including information indicating that there is no error, since there is no error in the latest three error amount determination results.

In contrast, when an input signal to which noise is added is input at sampling time t22, a difference between the first prediction value and the AD conversion value is above the normal range. As a result, the error amount detection unit 14 writes an error amount determination result indicating that there is an error in the memory 23. Furthermore, the determination unit 24 outputs an error detection signal including information indicating that there is an error. Similarly, at sampling time t23 and t24, the error amount determination unit 14 writes an error amount determination result indicating that there is an error, in the memory 23, and the determination unit 24 outputs error detection signal including information indicating that there is an error.

Thereafter, at sampling time t25, a difference between the first prediction value and the AD conversion value is within the normal range, and the error amount detection unit 14 writes an error amount determination result indicating that there is no error, in the memory 23. However, since the error amount determination results indicating that there is an error corresponding to sampling time t24 and t23 are stored in the memory 23, the determination unit 24 outputs an error detection signal including information indicating that there is an error.

At sampling time t26, a difference between the first prediction value and the AD conversion value is above the normal range, and the error amount detection unit 14 writes an error amount determination result indicating that there is an error, in the memory 23. Since the error amount determination result indicating that there is an error is included in the memory 23, the determination unit 24 outputs an error detection signal including information indicating that there is an error.

At each of sampling time t27 and t28, a difference between the first prediction value and the AD conversion value is within the normal range, and the error amount detection unit 14 writes an error amount determination result indicating that there is no error, in the memory 23. However, as in the case at sampling time t25, since the error amount determination result indicating that there is an error is included in the memory 23, and an error detection signal including information indicating that there is an error is output.

At and after sampling time t29, a difference between the first prediction value and the AD conversion value is within the normal range, and the error amount detection unit 14 writes an error amount determination result indicating that there is no error, in the memory 23. Since there is no error in the latest three error amount determination results in the memory 23, the determination unit 24 outputs an error detection signal including information indicating that there is no error.

In the fourth embodiment, a plurality of error amount determination results, from the latest to the oldest results, are stored in the memory 23, and the determination unit 24 determines whether an error amount determination result indicating that there is an error is included in the memory 23. When the error amount determination result indicating that there is an error is included, the determination unit 24 outputs the error detection signal indicating that there is an error. As a result, when sporadic disturbance noise is generated and a predetermined response time is required to remove the disturbance noise, a second prediction value from which the influence of the disturbance noise is removed is used as the AD conversion output result, for the predetermined response time. As a result, it is possible to obtain a result having a waveform closer to an output waveform obtained when only an ideal sinusoidal wave signal in which the disturbance noise is suppressed is input.

The third and fourth embodiments are provided on the basis of the second embodiment, but may be obtained on the basis of the first embodiment. In this case, the memory 17 is unnecessary. Further, the prediction logic unit 22 calculates the first prediction value according to one of formulas (1) to (3). In formulas (1) to (3), a first prediction value Ye1 (n+1) is calculated by using a past AD conversion value D1(x). The prediction logic unit 13 calculates the second prediction value according to any of formulas (1) to (3). According to formulas (1) to (3), the second prediction value Ye2(n+1) is calculated by using a past AD conversion output result D2(x).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processing device comprising:
an AD converter that converts an input signal to an AD conversion value at a sampling frequency;
a memory that stores an AD conversion output result;
a prediction logic circuit that predicts a prediction value by using the AD conversion output result at the sampling frequency;
an error amount detection circuit that determines that there is no error in error determination of the AD conversion value when an error amount between the prediction value and the AD conversion value is smaller than a predetermined amount, and that there is an error in the error determination when the error amount is equal to or larger than the predetermined amount; and a selector that outputs one of the AD conversion value and the prediction value as an AD conversion output result, on the basis of the error determination.

2. The signal processing device according to claim 1, wherein
the selector
outputs the AD conversion value as the AD conversion output result when the error determination represents that there is no error, and
outputs the prediction value as the AD conversion output result when the error determination represents that there is an error.

3. The signal processing device according to claim 1, wherein in the prediction logic circuit, let a be an integer of 1 or more, let n be an integer indicating a latest sampling time, and let four AD conversion output results be D(n−a+1), D(n−2a+1), D(n−3a+1), and D(n−4a+1), then Ye(n+1) being the prediction value is calculated according to the following formula (1)

$$Ye(n+1) = \frac{D(n-a+1) - D(n-4a+1) - D(n-2a+1) + D(n-3a+1)}{D(n-2a+1) - D(n-3a+1)} \times D(n-a+1) - D(n-2a+1). \tag{1}$$

4. The signal processing device according to claim 1, wherein in the prediction logic circuit, when the sampling frequency and a frequency of the input signal are known, let a fixed coefficient value determined by the sampling frequency and the frequency of the input signal be K, let a be an integer of 1 or more, let n be an integer indicating a latest sampling time, and let two AD conversion output results be D(n−a+1) and D(n−2a+1), then Ye(n+1) being the prediction value is calculated according to the following formula (2)

$$Ye(n+1) = K \cdot D(n-a+1) - D(n-2a+1) \tag{2}.$$

5. The signal processing device according to claim 4, wherein
the fixed coefficient value K is not less than −2 and not more than 2.

6. The signal processing device according to claim 4, further comprising
a second memory that stores the fixed coefficient value K.

7. The signal processing device according to claim 1, wherein
the prediction logic circuit predicts the prediction value, on an assumption that the input signal has a sinusoidal wave.

8. The signal processing device according to claim 1, further comprising
an amplitude/phase detection circuit that detects an amplitude and a phase of the input signal by using the AD conversion output result.

9. A signal processing device comprising:
an AD converter that converts an input signal to an AD conversion value at a sampling frequency;
a first memory that stores the AD conversion value;
a first prediction logic circuit that predicts a first prediction value by using the AD conversion value, at the sampling frequency;
a second memory that stores an AD conversion output result;
a second prediction logic circuit that predicts a second prediction value by using the AD conversion output result at the sampling frequency;
an error amount detection circuit that determines that there is no error in error determination of the AD conversion value when an error amount between the first prediction value and the AD conversion value is smaller than a predetermined amount, and that there is an error in the error determination when the error amount is equal to or larger than the predetermined amount; and
a selector which outputs one of the AD conversion value and the second prediction value as an AD conversion output result, on the basis of an error detection signal output according to a result of the error determination.

10. The signal processing device according to claim 9, further comprising
a third memory that stores results of two or more of the error determination; and
a determination circuit that outputs the error detection signal to the selector on the basis of a result of the error determination stored in the third memory.

11. The signal processing device according to claim 10, wherein
the determination circuit
outputs the error detection signal indicating that there is an error, when any result of the error determination indicating that there is an error is stored in the third memory, and
outputs the error detection signal indicating that there is no error, when a result of the error determination indicating that there is an error is not stored.

12. The signal processing device according to claim 9, wherein
the selector
outputs the AD conversion value as the AD conversion output result, when the error detection signal indicates that there is no error, and
outputs the second prediction value as the AD conversion output result, when the error detection signal indicates that there is an error.

13. The signal processing device according to claim 9, wherein
in the first prediction logic circuit, let a be an integer of 1 or more, let n be an integer indicating a latest sampling time, and let four AD conversion values be D1(n−a+1), D1(n−2a+1), D1(n−3a+1), D1(n−4a+1), then the first prediction value Ye1 (n+1) is calculated according to the following formula (3), and
in the second prediction logic circuit, let the four AD conversion output results be D2(n−a+1), D2(n−2a+1), D2(n−3a+1), D2(n−4a+1), then Ye2(n+1) being the second prediction value is calculated according to the following formula (4)

$$Ye1(n+1) = \frac{D1(n-a+1) - D1(n-4a+1) - D1(n-2a+1) + D1(n-3a+1)}{D1(n-2a+1) - D1(n-3a+1)} \times D1(n-a+1) - D1(n-2a+1) \quad (3)$$

$$Ye2(n+1) = \frac{D2(n-a+1) - D2(n-4a+1) - D2(n-2a+1) + D2(n-3a+1)}{D2(n-2a+1) - D2(n-3a+1)} \times D2(n-a+1) - D2(n-2a+1). \quad (4)$$

14. The signal processing device according to claim 9, wherein in the first prediction logic circuit, when the sampling frequency and a frequency of the input signal are known, let a fixed coefficient value determined by the sampling frequency and the frequency of the input signal be K, let a be an integer of 1 or more, let n be an integer indicating a latest sampling time, and let two AD conversion values be $D1(n-a+1)$ and $D1(n-2a+1)$, then $Ye1(n+1)$ being the first prediction value is calculated according to the following formula (5), and in the second prediction logic circuit, let two AD conversion output results be $D2(n-a+1)$ and $D2(n-2a+1)$, then $Ye2(n+1)$ being the second prediction value is calculated according to the following formula (6)

$$Ye1(n+1) = K \cdot D1(n-a+1) - D1(n-2a+1) \quad (5)$$

$$Ye2(n+1) = K \cdot D2(n-a+1) - D2(n-2a+1). \quad (6)$$

15. The signal processing device according to claim 14, wherein the fixed coefficient value K is not less than −2 and not more than 2.

16. The signal processing device according to claim 9, further comprising an amplitude/phase detection circuit that detects an amplitude and a phase of the input signal by using the AD conversion output result.

17. The signal processing device according to claim 10, wherein the third memory stores a result of the error determination for a period in which noise added to the input signal is reduced.

18. The signal processing device according to claim 14, further comprising a fourth memory that stores the fixed coefficient value K.

19. The signal processing device according to claim 9, wherein

The first prediction logic circuit predicts the first prediction value and the second prediction logic circuit predicts the second prediction value, on an assumption that the input signal has a sinusoidal wave.

\* \* \* \* \*